US006476586B2

(12) United States Patent
Yunosawa et al.

(10) Patent No.: US 6,476,586 B2
(45) Date of Patent: Nov. 5, 2002

(54) CAPACITOR CHARGE CONTROL CIRCUIT AND MICROCOMPUTER USING THE SAME

(75) Inventors: Yoshinori Yunosawa, Nukata-gun (JP); Hideaki Ishihara, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/902,504

(22) Filed: Jul. 11, 2001

(65) Prior Publication Data

US 2002/0030469 A1 Mar. 14, 2002

(30) Foreign Application Priority Data

Jul. 11, 2000 (JP) ...................................... 2000-209851

(51) Int. Cl.[7] .............................. H02J 7/00; H03K 3/00

(52) U.S. Cl. ....................................... 320/166; 307/108

(58) Field of Search ................................ 320/166, 140; 327/551; 307/108, 109

(56) References Cited

U.S. PATENT DOCUMENTS 6,326,772 B2 * 12/2001 Kusumoto et al. .......... 307/109

* cited by examiner

*Primary Examiner*—Gregory J. Toatley, Jr.
(74) *Attorney, Agent, or Firm*—Law Offices of David G. Posz

(57) ABSTRACT

A microcomputer has a CPU, a charge and discharge control circuit connected to the CPU, an input/output port, and comparator. A capacitor is connected to the microcomputer through the input/output port. The comparator outputs a high level signal or a low level signal based on a voltage of the capacitor to the CPU. The charge and discharge control circuit is composed of a totem pole structure having a high side and a low side n-channel type MOSFETs whose common drain terminal serves as an output terminal of the circuit. The high side MOSFET charges the capacitor, and the low side MOSFET discharges the capacitor based on signals from the CPU through the input/output port. The high side MOSFET does not have a parasitic diode whose anode is connected to a power supply and cathode is connected to the common drain terminal.

6 Claims, 3 Drawing Sheets

CAPACITOR CHARGE CONTROL CIRCUIT AND MICROCOMPUTER USING THE SAME

CROSS REFERENCE TO RELATED APPLICATION

This application is based upon Japanese Patent Application No. 2000-209851 filed on Jul. 11, 2000, the contents of which are incorporated herein by reference.

BACKGROUND OF THE INVENTION

1. Field of the Invention

This invention relates to a capacitor charge control circuit and a microcomputer using the circuit.

2. Description of the Related Art

Recently, plural ECUs (Electronic Control Units) are disposed in a vehicle to perform plural kinds of control of the vehicle. One of the EUCs unlocks doors of the vehicle when the ECU detects the vehicle is crashed, so that users can get out of the vehicle easily after the vehicle is crashed.

Such the ECU is shown in FIG. 3. A microcomputer 1 in the ECU has output ports 2*a* and 2*b*. Each of the ports 2*a*, 2*b* is connected to each of output interface circuits. Each of the output interface circuits is formed inside the microcomputer 1, and has a CMOS structure composed of a p-channel type MOSFET 3 (high side FET) whose source is connected to a power supply terminal, and an n-type MOSFET 4 (low side FET) whose source is connected to a ground terminal. A drain and a gate of the FET 4 are connected to a drain and a gate of the FET 3 respectively to form a common gate and a common drain. The common gate is driven by an output signal from a CPU 17 to turn on/off the FETS. Each common drain of the output interface circuits is connected to the each of the output port 2*a*, 2*b*. Incidentally, a parasitic diode 5 or 6 is formed between the source and the drain in each of the FETs 3 and 4.

The output port 2*a* is electrically connected to the ground through a series connected circuit composed of a resistor 7, a diode 8 and a capacitor 9. The output port 2*b* is connected to a base of an NPN bi-polar transistor 11 through a resistor 10. A collector of the bi-polar transistor 11 is connected to a junction point between the diode 8 and the capacitor 9 through a resistor 12. An emitter of the bi-polar transistor 11 is connected to the ground and the base thereof through a resistor 13.

A junction point between the resistor 7 and the diode 8 is connected to an input port 15 of the microcomputer 1 through a resistor 14. The input port 15 is connected to an input terminal of a comparator 16. The comparator 16 outputs a signal to the CPU 17. Protection diodes 18 and 19. are connected between the power supply terminal and the input terminal, and between the input terminal and the ground, respectively.

When the vehicle crashes, an acceleration sensor disposed inside the vehicle detects impact caused by the crash as an acceleration signal. After the CPU 17 receives the acceleration signal from the sensor, the CPU 17 changes the output signal, applied to the FETs 3 and 4 at the output port 2*a*, from high level to low level. As a result, the FET 3 turns on, and the FET 4 turns off, so that the capacitor 9 is charged through the resistor 7 and the diode 8.

In other words, there is a case where voltage of a battery (power source) drops instantaneously when the vehicle crashes. Consequently, the CPU 17 memorizes information that a large impact is applied to the vehicle (an abnormal situation such as the crash has occurred) by charging the capacitor 9 based on the signal from the acceleration sensor. When the CPU 17 restarts after being reset by a power-on-reset (activating sequence of the CPU 17), the CPU 17 refers to an output signal of the comparator 16, and determines whether a voltage level of the capacitor 9 is high or low.

In case of normal situation where the vehicle dose not crash, the capacitor 9 is not charged. Namely, the voltage of the capacitor 9 is at a low level after the power-on-reset. Therefore, the ECU does not perform anything based on the capacitor 9.

On the other hand, in case of the crash, the CPU 17 detects the voltage of the capacitor 9 is at a high level, so that the ECU performs a process for unlocking the doors of the vehicle or the like.

Incidentally, a circuit connected to the output port 2*b*, in which the transistor 11 is included, is arranged to discharge the capacitor 9. The circuit discharges the capacitor 9 by turning on the transistor 11 after the CPU 17 checks the voltage of the capacitor 9. Accordingly, the capacitor 9 serves as a memory of 1 bit or a simplified memory.

Incidentally, the diode 8 prevents charges of the capacitor 9 from leaking. If the diode 8 is not disposed, the charges of the capacitor 9 can be discharged through the parasitic diode 5 when a voltage of the battery drops down to under a forward voltage of the diode 5. Therefore, the diode 8 is disposed as shown in FIG. 3.

Thus, although the CMOS (Complementary MOS) structure is disposed at the output port 2*a*, the FET 4 in the low side of the CMOS cannot discharge the capacitor 9 because of the diode 8. Accordingly, the other CMOS circuit is disposed at the output port 2*b* for discharging the capacitor 9. Moreover, a similar problem caused by the parasitic diode 5 occurs at the other CMOS circuit, so that the transistor 11 is required to discharge the capacitor 9. Therefore, a circuit diagram is complicated inevitably.

SUMMARY OF THE INVENTION

This invention has been conceived in view of the background as described above and an object of the invention is to provide a capacitor charge control circuit capable of being composed of a simple circuit, and to provide a microcomputer using the same.

According to a first aspect of the present invention, two n-type MOSFETs are connected with each other so as to form a totem pole connection, i.e., to form a series connection. Output terminals of the MOSFETs are connected to a capacitor at a common connecting point.

Incidentally, the two MOSFETs may work a discharging circuit of the capacitor altogether.

Preferably, one of the MOSFETs works as a charging circuit, and the other of the MOSFETs works as a discharging circuit. In this case, a port of the microcomputer for outputting charges from the one of the MOSFETs can be served as a port for discharging charges of the capacitor through the other of the MOSFETs.

Other objects, features and advantages of the present invention will become more apparent from the following detailed description made with reference to the accompanying drawings.

DESCRIPTION OF THE EMBODIMENTS

Figure 1:
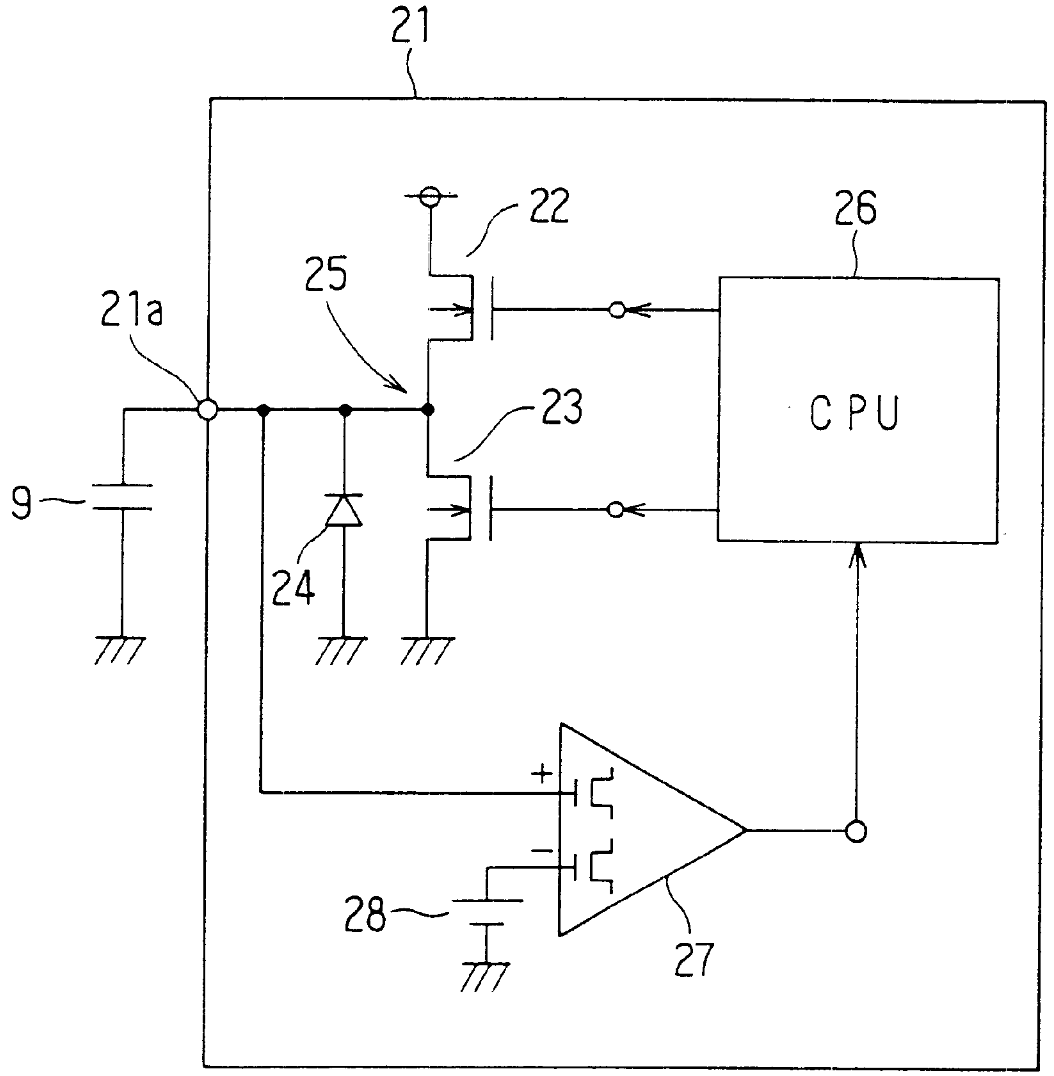
FIG. 1 is a schematic circuit diagram of a first embodiment of the present invention.

Specific embodiments of the present invention will now be described hereinafter with reference to the accompanying drawings in which the same or similar component parts are designated by the same or similar reference numerals.

(First Embodiment)

A microcomputer 21, which constitutes an ECU for a vehicle, is formed in a semiconductor chip, for example. The microcomputer 21 has a totem pole connection type circuit, a CPU 26, a comparator 27, and an input/output port (I/O port). Incidentally, a power supply port and a ground port or the like, which are provided in the microcomputer 21 naturally, are omitted in FIG. 1 (FIG. 2).

The totem pole connection type circuit is composed of a high side and low side n-channel type MOSFETs 22 and 23. A source terminal of the FET 22 is connected to a power source. A source terminal of the FET 23 is connected to a ground. A drain terminal of the FET 22 is connected to a drain terminal of the FET 23. The drain terminals of the FETs 22 and 23 are connected to an input/output (I/O) port 21*a* at a common connection. Hereinafter, the drain terminals of the FETs 22 and 23 are referred to as a common drain terminal.

Moreover, the FETs 22 and 23 are formed on a common p-type substrate so as to have a common back gate. The common back gate of the FETs 22 and 23, in which channels are formed, is connected to the ground, so that a parasitic diode 24 is formed between the common drain terminal (n-type) and the common back gate (p-type). In other words, the parasitic diode 24 is connected backward to the FET 23.

The I/O port 21*a* is connected to a plus terminal of the capacitor 9. A minus terminal of the capacitor 9 is connected to the ground. Therefore, the totem pole connection type circuit constitutes a charge and discharge control circuit (electric charge control circuit) 25. Gate terminals of the FETs 22 and 23 are independently controlled by a gate driving circuit (not shown) formed in a CPU 26. The capacitor 9 (simplified memory) has a capacitance of about 1 μF.

A non-inverted input terminal of a comparator (voltage determining means) 27 is connected to the I/O port 21*a*, and an inverted input terminal of the comparator 27 is connected to a reference voltage source 28. The comparator 27 is composed of plural MOSFETs. The comparator 27 outputs a high level signal to the CPU 26 when a voltage of the capacitor 9 at the I/O port 21*a* is higher than a voltage of the reference voltage source 28. An input portion of the comparator 27 is capable of undergoing a high withstanding voltage, so that a protection diode is not required at the input portion.

Next, an operation of this embodiment will be described. When a crash happens to a vehicle, an acceleration sensor (not shown) detects impact of the crash as a change of state of the vehicle, and outputs a detection signal to the CPU 26. The CPU 26 applies a high level signal only to the gate of the FET 22 so as to turn on the FET 22. The capacitor 9 is then charged by the FET 22 through the I/O port 21*a* from a power supply Vcc.

After the capacitor is charged sufficiently, the FET 22 is turned off, whereby the plus terminal of the capacitor 9 is provided high impedance so that the capacitor 9 remains charged. Moreover, since the parasitic diode 24 is connected to the ground, and since a parasitic diode, whose anode is connected to the power source and cathode is connected to the common drain terminal, is not formed in the FET 22, there is no path to discharge the capacitor 9.

Then, the microcomputer 21 is reset. After the microcomputer 21 is reset, the microcomputer 21 refers to an output signal of the comparator 27. In this case, since the capacitor has been charged up, the output signal is set at a high level. The CPU 26 detects the output signal set at the high level, then, the CPU 26 applies a high level signal only to the gate of the FET 23 so as to turn on the FET 23. The capacitor 9 is then discharged to the ground through the I/O port 21*a* and the FET 23. Subsequently, the CPU 26 outputs an activation signal to a door-locking activating circuit (not shown) so that all doors of the vehicle are changed in state from locked to unlocked.

As described above, the charge and discharge control circuit (electric charge control circuit) 25 for the capacitor 9 as the simplified memory is composed of the totem pole connection type to circuit having the FETs 22 and 23. Moreover, a ground potential is applied to common back gate of the FETs 22 and 23 so that the parasitic diode 24 is formed only in the FET 23, and so that a parasitic diode is not formed between the drain terminal of the FET 22 and the power source. As a result, charge held by the capacitor 9 is not discharged to the power supply, thereby not requiring a discrete transistor, such as the transistor 11 shown in FIG. 3, to discharge the capacitor 9. Therefore, the circuit diagram is simplified.

Moreover, charging and discharging of the capacitor 9 is simplified since the FET 22 can be used for charging and the FET 23 can be used for discharging. In addition, a discharging prevention diode is not necessary, whereby scale of the circuit can be miniaturized efficiently.

Moreover, the comparator 27 has the input portion capable of undergoing a high withstanding voltage, so that the protection diode is not required. As a result, the non-inverted input terminal is directly connected to the plus terminal of the capacitor 9. Accordingly, a port for referencing to the voltage of the capacitor 9 such as the port 15 shown in FIG. 3 can be cut down by using the I/O port 21*a* as a reference port in common with the charge and discharge circuit 25. As a result, the microcomputer 21 can be connected the capacitor 9 only through the I/O port 21*a*, whereby the number of ports can be minimized so that chip scale of the microcomputer can be miniaturized.

Further, when a logic circuit such as a flip-flop circuit is employed to memorize information indicating the change of the state of the vehicle, the information might not be secured by the logic circuit reliably since the power supply to the logic circuit may drop to such a degree that the flip-flop circuit cannot keep the information memorized therein. On the other hand, in this embodiment, the capacitor 9 can keep the information indicating the change of the state of the vehicle reliably even if the power supply to the microcomputer 21 drops.

(Second Embodiment)

Figure 2:
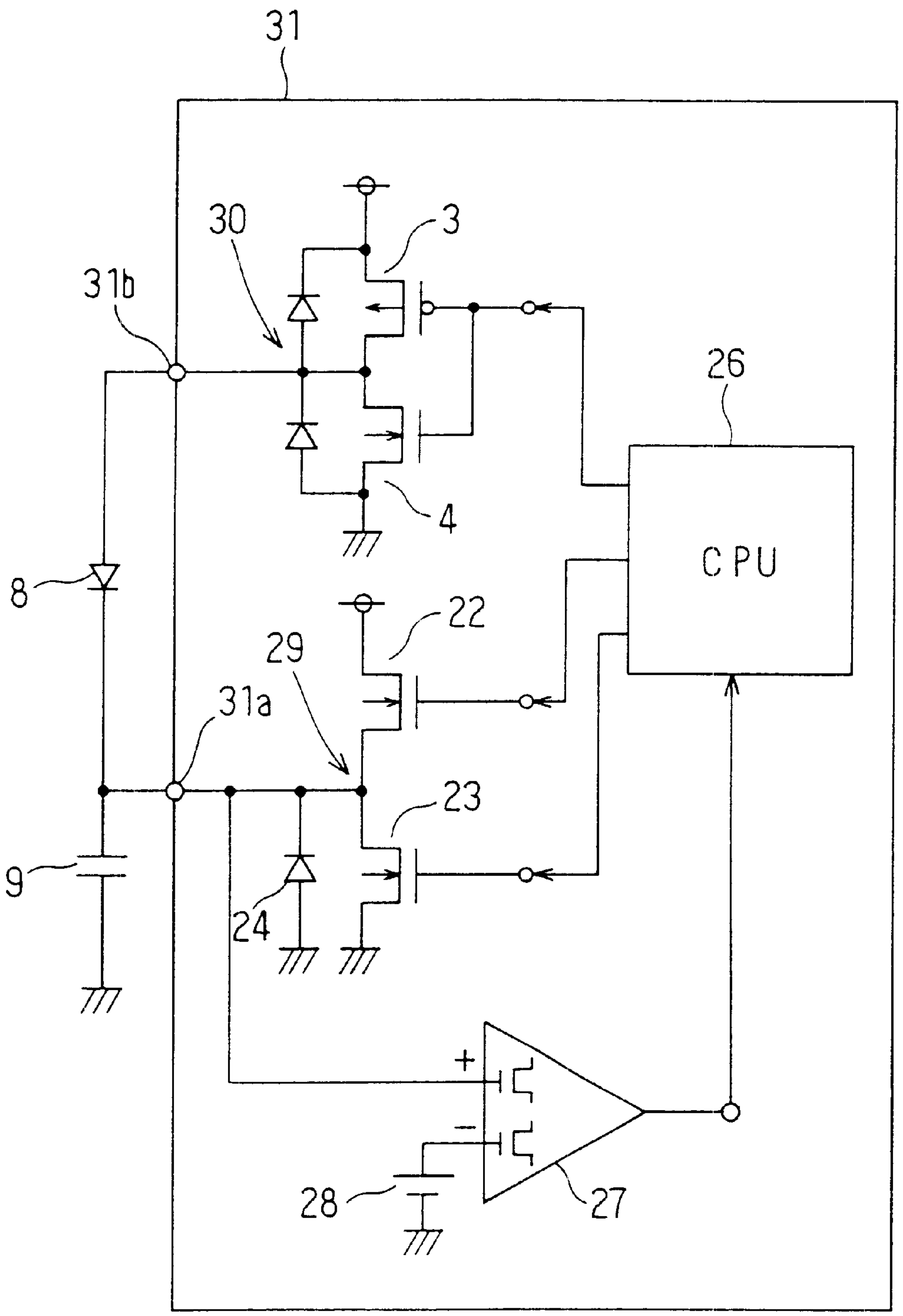
FIG. 2 is a schematic circuit diagram of a second embodiment of the present invention.

Referring to FIG. 2, the same circuit structure as the charge and discharge control circuit 25 in the first embodiment shown in FIG. 1 is employed as a discharge control circuit (electric charge control circuit) 29 in the second embodiment. Moreover, the same circuit structure as the CMOS circuit composed of the p-type MOSFET 3 and the n-type MOSFET 4 shown in FIG. 3 is employed as a charge control circuit 30.

The common drain terminal of the FETs 22 and 23 is connected to the plus terminal of the capacitor 9 through an I/O port 31*a*. The common drain terminal of the CMOS circuit is connected to an anode of a diode 8 with a resistor (not shown) interposed therebetween through an output port 31*b*. Similarly to the first embodiment, a comparator 27 is connected to the I/O port 31*a* through a non-inverted input terminal thereof.

CPU 26 in the microcomputer 31 charges the capacitor 9 by turning on the FET 3, and discharges the capacitor 9 by turning on the FET 23 as described in the first embodiment.

Figure 3:
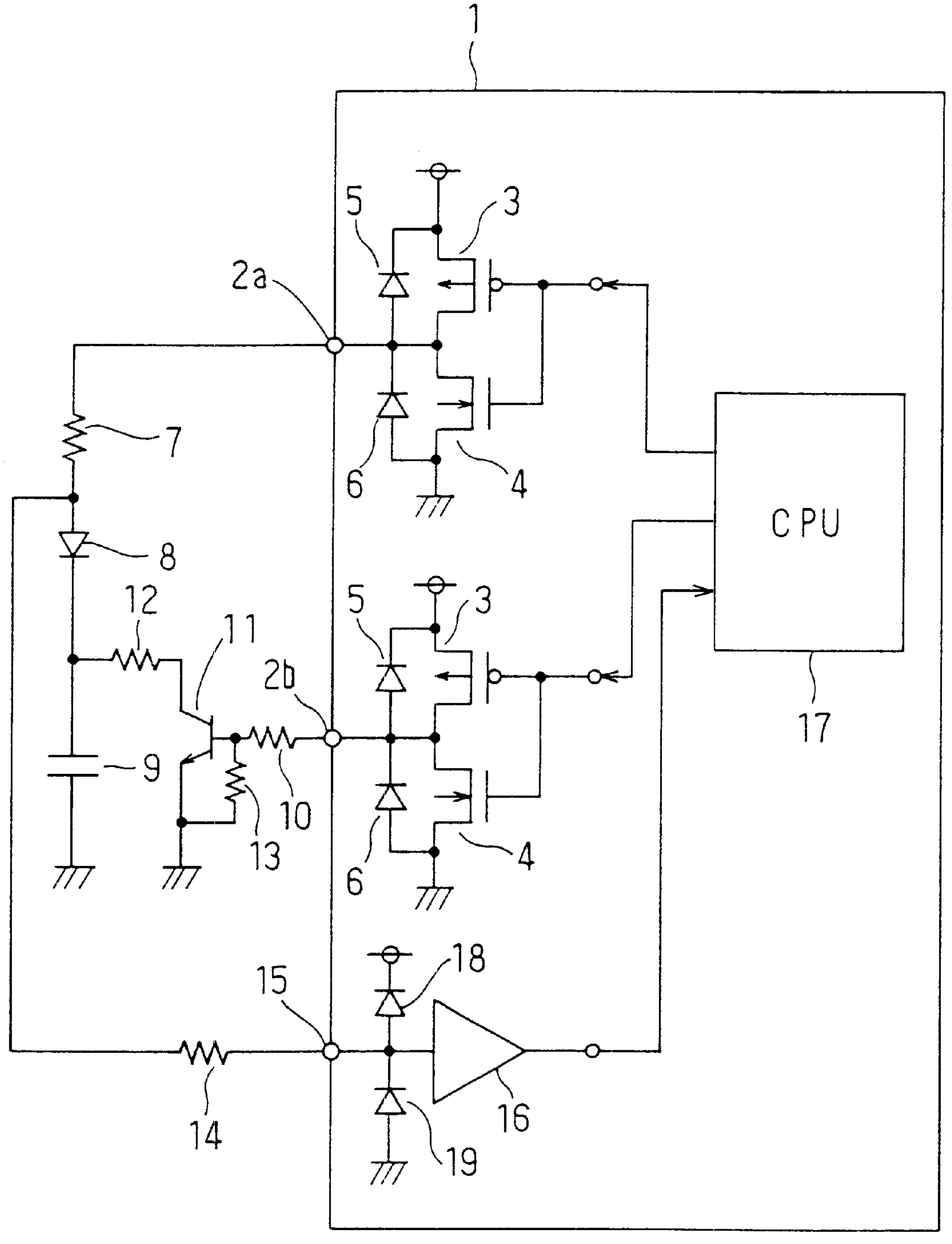
FIG. 3 is a schematic circuit diagram of a prototype.

According to the second embodiment described above, at least a discrete transistor, which is required in the circuit shown in FIG. 3 to discharge the capacitor 9, is not necessary by employing the totem pole connection type circuit composed of the n-type MOSFETs 22 and 23 as the discharge control circuit 29.

Modification of the circuit as shown in FIGS. 1 and 2 will be described. An inverter may be employed as the voltage determining means instead of the comparator 27. An input port may be formed in the microcomputer 21 or 31 other than the I/O port 21*a* or 31*a*, which is connected to the non-inverted input terminal of the comparator 27 in the first or second embodiment. In this case, in the second embodiment, a diode for protecting the input portion of the comparator 27 may be employed, and an anode of the diode is connected to the input port in a case that a high withstanding voltage structure described above is not adopted to the input portion of the comparator 27.

The microcomputer is not limited to be adopted to memorize an occurrence of a crash of the vehicle in the simplified memory, but may be adopted to memorize other information in the simplified memory.

While the present invention has been shown and described with reference to the foregoing preferred embodiments, it will be apparent to those skill in the art that changes in form and detail may be made therein without departing from the scope of the invention as defined in the appended claims.

What is claimed is:

1. A microcomputer having a capacitor control circuit for memorizing information, comprising:

a main control unit;

a capacitor charging control circuit connected to, and controlled by the main control unit;

a capacitor connected to, and charged and discharged by the capacitor control circuit; and a capacitor voltage determining circuit having an input terminal connected the capacitor and an output terminal connected to the main control unit, wherein:

the capacitor charging control circuit has:

a charge control circuit connected to the capacitor, for charging the capacitor based on a charge signal applied by the main control unit; and a discharge control circuit connected to the capacitor for discharging the capacitor based on a discharge signal applied thereto, wherein:

at least the discharge control circuit is composed of a totem pole structure having a high side n-channel type MOSFET and a low side n-channel type MOSFET, drain terminals of the high side n-channel type MOSFET and low side n-channel type MOSFET are electrically connected to the capacitor at a common connection.

2. A microcomputer according to claim 1, wherein the high side n-channel type MOSFET serves as the charge control circuit.

3. A microcomputer according to claim 2, further comprising:

a substrate, on which the main control unit, the capacitor control circuit, and the capacitor voltage determining circuit are formed, the substrate having an input/output port, wherein:

the charge control circuit and the discharge control circuit are connected to the capacitor through the input/output port.

4. A microcomputer according to claim 3, wherein the capacitor voltage determining circuit is connected to the capacitor through the input/output port.

5. A microcomputer according to claim 2, further comprising:

an electric path that is formed between a power source, which connects to a source of the high side n-channel type MOSFET, and the drain terminal of the high side n-channel type MOSFET without a parasitic diode whose anode is connected to a power source and cathode is connected to the drain terminal of the high side n-type channel MOSFET.

6. A microcomputer according to claim 2, wherein:

the charge control circuit has a CMOS structure having a high side p-channel type MOSFET and a low side n-channel type MOSFET, drain terminals of the high side p-channel type MOSFET and the low side n-channel type MOSFET are connected to the capacitor.

* * * * *